US011421316B2

(12) United States Patent
Lianto et al.

(10) Patent No.: US 11,421,316 B2
(45) Date of Patent: Aug. 23, 2022

(54) METHODS AND APPARATUS FOR CONTROLLING WARPAGE IN WAFER LEVEL PACKAGING PROCESSES

(71) Applicant: APPLIED MATERIALS, INC., Santa Clara, CA (US)

(72) Inventors: Prayudi Lianto, Singapore (SG); Mohamed Rafi, Singapore (SG); Muhammad Azim Bin Syed Sulaiman, Singapore (SG); Guan Huei See, Singapore (SG); Ang Yu Xin Kristy, Singapore (SG); Karthik Elumalai, Bangalore (IN); Sriskantharajah Thirunavukarasu, Singapore (SG); Arvind Sundarrajan, Singapore (SG)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 16/584,695

(22) Filed: Sep. 26, 2019

(65) Prior Publication Data
US 2020/0131624 A1 Apr. 30, 2020

Related U.S. Application Data

(60) Provisional application No. 62/751,200, filed on Oct. 26, 2018.

(51) Int. Cl.
*H01L 23/48* (2006.01)
*H01L 23/52* (2006.01)
(Continued)

(52) U.S. Cl.
CPC ...... *C23C 14/541* (2013.01); *H01L 21/67248* (2013.01); *H01L 21/67288* (2013.01);
(Continued)

(58) Field of Classification Search
CPC ............ F27B 17/0025; H01L 21/3247; H01L 21/67288
See application file for complete search history.

(56) References Cited

U.S. PATENT DOCUMENTS 5,028,983 A * 7/1991 Bickford ............... H01L 24/50
257/668
8,916,416 B2 12/2014 Omandam et al.
(Continued)

FOREIGN PATENT DOCUMENTS

KR 10-1393700 B1 5/2014

OTHER PUBLICATIONS

International Search Report for PCT/US2019/057341, dated Feb. 12, 2020.
(Continued)

*Primary Examiner* — Bradley Smith
*Assistant Examiner* — David J Goodwin
(74) *Attorney, Agent, or Firm* — Moser Taboada

(57) ABSTRACT

Methods and apparatus for producing fine pitch patterning on a substrate. Warpage correction of the substrate is accomplished on a carrier or carrier-less substrate. A first warpage correction process is performed on the substrate by raising and holding a temperature of the substrate to a first temperature and cooling the carrier-less substrate to a second temperature. Further wafer level packaging processing is then performed such as forming vias in a polymer layer on the substrate. A second warpage correction process is then performed on the substrate by raising and holding a temperature of the substrate to a third temperature and cooling the substrate to a fourth temperature. With the warpage of the substrate reduced, a redistribution layer may be formed on the substrate with a 2/2 μm l/s fine pitch patterning.

15 Claims, 3 Drawing Sheets

(51) Int. Cl.
- *C23C 14/54* (2006.01)
- *H01L 21/67* (2006.01)
- *H01L 23/00* (2006.01)

(52) U.S. Cl.
CPC ...... *H01L 24/08* (2013.01); *H01L 2224/0233* (2013.01); *H01L 2224/02372* (2013.01); *H01L 2924/3511* (2013.01)

(56) References Cited

U.S. PATENT DOCUMENTS

| | | | |
|---|---|---|---|
| 9,385,006 | B2 | 7/2016 | Lin et al. |
| 9,449,943 | B2 | 9/2016 | Lin et al. |
| 9,818,624 | B2 * | 11/2017 | Lew .................... H01L 21/3247 |
| 10,163,802 | B2 * | 12/2018 | Lin .......................... H01L 24/73 |
| 10,325,790 | B2 * | 6/2019 | Peh .................. H01L 21/67017 |
| 2012/0244664 | A1 | 9/2012 | Jin et al. |
| 2014/0045300 | A1 | 2/2014 | Chen et al. |
| 2014/0091470 | A1 | 4/2014 | Sane et al. |
| 2015/0371884 | A1 | 12/2015 | Dauksher et al. |
| 2015/0380334 | A1 | 12/2015 | Hu et al. |
| 2016/0240423 | A1 * | 8/2016 | Matsunaga ......... H01L 21/6838 |
| 2016/0268149 | A1 * | 9/2016 | Chung ............. H01L 21/68785 |
| 2016/0322234 | A1 * | 11/2016 | Lew .......................... F27B 9/10 |
| 2020/0131624 | A1 * | 4/2020 | Lianto ............... H01L 21/67248 |

OTHER PUBLICATIONS

Patent Issues of Embedded Fan-Out Wafer/Panel Level Packaging John H. Lau ASM Pacific Technology, Hong Kong, China John. lau@asmpt.com.

‡Yole Development, The Growth of Advanced Packaging Technology Overview, Applications and Market Trends, Semicon Taiwan Taipei Sep. 1, 2015, Rozalia Beica Chief Technology Officer beica@yole.fr.

* cited by examiner

METHODS AND APPARATUS FOR CONTROLLING WARPAGE IN WAFER LEVEL PACKAGING PROCESSES

CROSS-REFERENCE TO RELATED APPLICATIONS

This application claims the benefit of U.S. provisional patent application Ser. No. 62/751,200, filed Oct. 26, 2018 which is herein incorporated by reference in its entirety.

FIELD

Embodiments of the present principles generally relate to semiconductor processes used in packaging semiconductor devices.

BACKGROUND

A semiconductor wafer is processed to form structures on the wafer surface. The structures on a particular region of the wafer can be linked together to form a microcircuit. The wafer may have many different microcircuits constructed on the wafer's surface during processing. Once the wafer has finished being processed, the wafer is cut apart or singulated to separate the microcircuits into semiconductor 'chips.' The chips often contain complex circuitry which needs to interact with external components. The chip's internal circuitry is too minute to be connected directly to the external components. To overcome the external connection issues, lead outs are formed that are connected to the internal circuitry of a chip to a pad or solder ball that allows for external connections. The lead outs are formed in what is known as a 'redistribution layer' during follow-on package processing of the semiconductor chips.

Chips from different wafers may be combined together by placing the chips on a surface and pouring a molding compound over the chips to again form a new wafer or a 'reconstituted wafer.' The molding compound hardens so that the chips can be handled in unison for redistribution layer processing. A common technique is to bond the reconstituted wafer to a temporary carrier to provide rigidity during processing. However, the temporary bonding and then debonding is expensive and time consuming so carrierless techniques may also be employed. During the wafer level packaging processes, the wafer may become warped. The warpage impedes the ability to form fine pitched RDL layers on the wafer, substantially reducing yields.

Thus, the inventors have provided improved methods for controlling warpage during wafer level packaging processes.

SUMMARY

Methods for controlling warpage in wafer level packaging processes to increase yields, especially for fine pitched RDL layers.

In some embodiments, a method of fine pitch patterning on a substrate in a wafer level packaging process comprises performing a first warpage correction process on the substrate by ramping to and holding the substrate at a first temperature for a first duration and ramping to and holding a second temperature for a second duration, wherein the first temperature is greater than the second temperature, forming vias in a polymer layer on the substrate, curing the polymer layer, performing a second warpage correction process on the substrate by ramping to and holding the substrate at a third temperature for a third duration and ramping to and holding the substrate at a fourth temperature for a fourth duration, wherein the third temperature is greater than the fourth temperature, and forming a redistribution layer on the substrate with a fine pitch patterning having a line/space of 10/10 μm or less.

In some embodiments, the method may further include wherein the fine pitch patterning has a line/space of 5/5 μm or less, wherein the fine pitch patterning has a line/space of 2/2 μm or less, wherein the substrate has a warpage of 500 μm or less after the second warpage correction process, wherein the substrate has a warpage of 400 μm or less after the second warpage correction process, wherein the first temperature of the first warpage correction process is greater than the third temperature of the second warpage correction process, wherein the first temperature of the first warpage correction process is approximately equal to the third temperature of the second warpage correction process, wherein a subsequent first temperature of a subsequent first warpage correction process is based on the first temperature of the first warpage correction process, wherein the first temperature is approximately a glass transition temperature of the polymer layer on the substrate, wherein the first temperature, the second temperature, the third temperature, or the fourth temperature is obtained by ramping linearly, wherein the first temperature is lower than a glass transition temperature of the polymer layer when a plasma vapor deposition (PVD) process has been performed prior to the first warpage correction process, wherein the substrate is a reconstituted wafer composed of multiple dies, and/or performing a chemical mechanical polishing (CMP) process to enhance the fine pitch patterning.

In some embodiments, a method of fine pitch patterning on a substrate in a wafer level packaging process comprises determining material composition, thickness, or prior processing of the substrate; heating the substrate to a first temperature over a first time period based on the material composition, thickness, or prior processing of the substrate; maintaining the substrate at the first temperature for a second time period; and cooling the substrate to a second temperature over a second time period based on the material composition, thickness, or prior processing of the substrate.

In some embodiments, the method may further include wherein the first temperature is approximately 150 degrees Celsius to 220 degrees Celsius, wherein the first temperature is reduced when a prior processing of the substrate includes a physical vapor deposition (PVD) process, wherein the first temperature is above a glass transition temperature of a material of the substrate, and/or wherein the first temperature is approximately 175 degrees Celsius.

In some embodiments, a non-transitory, computer readable medium having instructions stored thereon that, when executed, cause a method of fine pitch patterning on a substrate in a wafer level packaging process to be performed, the method comprises performing a first warpage correction process on the substrate by ramping to and holding the substrate at a first temperature for a first duration and ramping to and holding a second temperature for a second duration, wherein the first temperature is greater than the second temperature; forming vias in a polymer layer on the substrate; curing the polymer layer; performing a second warpage correction process on the substrate by ramping to and holding the substrate at a third temperature for a third duration and ramping to and holding the substrate at a fourth temperature for a fourth duration, wherein the third temperature is greater than the fourth temperature; and forming a redistribution layer on the substrate with a fine pitch patterning having a line/space of 10/10 μm or less.

In some embodiments, the method may further include wherein the first temperature of the first warpage correction process is greater than the third temperature of the second warpage correction process, wherein the substrate has a warpage of 400 µm or less after the second warpage correction process, and wherein the fine pitch patterning has a line/space is 2/2 µm or less.

Other and further embodiments are disclosed below.

BRIEF DESCRIPTION OF THE DRAWINGS

Embodiments of the present principles, briefly summarized above and discussed in greater detail below, can be understood by reference to the illustrative embodiments of the principles depicted in the appended drawings. However, the appended drawings illustrate only typical embodiments of the principles and are thus not to be considered limiting of scope, for the principles may admit to other equally effective embodiments.

Figure 1:
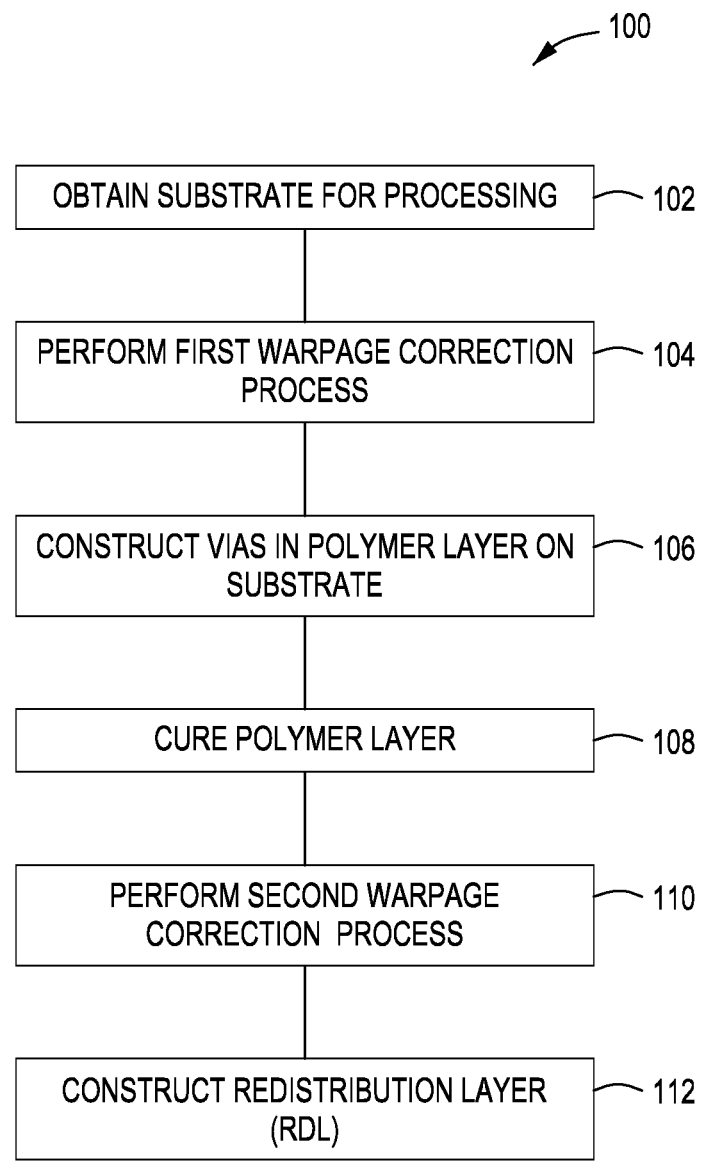
FIG. 1 is a method of incorporating warpage control during a wafer level packaging process in accordance with some embodiments of the present principles.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

The disclosed methods and apparatus allow warpage correction during fan-in and fan-out wafer level packaging processes. The warpage correction may be performed before a first, second, and/or $n^{th}$ redistribution layer (RDL) formation. The warpage correction may also be inserted at any step during the RDL fabrication. The methods may be accomplished in carrier-less-based wafer level packaging processes or with carrier-based wafer level packaging processes. Even though carrier-based wafer level packaging processes provide a level of rigidity, as more and more layers are stacked, warpage may become a factor. By controlling the substrate warpage during the wafer level packaging processes, fine pitch RDL patterning can be obtained with within-wafer yield for high input/output (I/O) chip-to-chip interconnect routing. The techniques of the present principles do not introduce additional materials into the wafer level packaging process nor expensive carrier processes that require additional bonding/debonding, back grinding, and copper pillar steps. The lack of complicated process tools and added materials allows outsourced semiconductor assembly and test (OSAT) entities to perform the methods as well.

The warpage correction can be advantageously accomplished at any portion of a fan-out flow or a fan-in flow. The flexibility of inserting the warpage correction at any point in a process flow permits OSAT entities to utilize the warpage correction whether the entity has the toolset to perform a complete process flow or only a partial process flow. The techniques of the present principles advantageously allow for fine pitch patterning of less than 10/10 µm l/s. In some embodiments, high yields may be obtained for 5/5 µm l/s and even 2/2 µm l/s of RDL layers. In some embodiments, a yield of approximately 90% or greater is achievable for 5/5 µm l/s. In some embodiments, a yield of approximately 50% or greater is achievable for 2/2 µm l/s, not only for patterning but as electrically functional RDLs. In some embodiments, the warpage correction provides a warpage value of less than approximately 500 µm. In some embodiments, the warpage correction provides a warpage value of less than approximately 400 µm. Most OSAT entities cannot achieve a cost-effective yield for 2/2 µm l/s in a carrier-less process flow. Carrier-based processes require expensive tooling that OSAT entities do not possess. The techniques of the present principles provide an opportunity for OSAT entities to produce such a cost-effect approach to producing 2/2 µm l/s.

FIG. 1 is a method 100 of incorporating warpage control during a wafer level packaging process in accordance with some embodiments. Warpage tends to occur whenever there is an abrupt change in temperature during processing. Molding processes and polymer curing steps are examples that can cause abrupt temperature changes and substrate warpage. In block 102, a substrate is obtained for processing. In some embodiments, the substrate may include a reconstituted wafer composed of multiple dies that have been overmolded into a single wafer. The curing of the overmold produces heat that can lead to warping of the reconstituted wafer. The warpage makes fine patterning on the wafer difficult. In block 104, a first warpage correction process as described below is performed on the substrate. In the case of the reconstituted wafer, the first warpage correction produces a flatter surface that is more optimal for fine pitch patterning. In block 106, vias are constructed in a polymer layer on the substrate. In some embodiments, the vias may be formed using a lithography process. The vias are typically filled with a copper material to allow connections between layers of the substrate. In block 108, the polymer layer with the vias is cured. The polymer curing process may reach temperatures of 220 degrees Celsius causing large warpage values after the via formation. In block 110, a second warpage correction process is performed on the substrate. The second warpage correction process smooths out the surface of the substrate so that subsequent processes can achieve fine pitch patterning. The second warpage correction process is especially important after the high curing temperatures of polymer materials used in via formation processes. In block 112, an RDL layer is constructed on the substrate. As described here, in some embodiments, the warpage correction process may be performed repeatedly during the wafer level packaging process so that a high yield fine pitch RDL can be achieved.

In some embodiments, the warpage correction may be used in conjunction with a chemical mechanical polishing (CMP) process. The CMP process is used to reduce step-height after die overmolding. By performing a CMP process and warpage correction, yields for fine pitch patterning may be dramatically increased compared to CMP processing or warpage correction processing alone.

In some processes, a physical vapor deposition process (PVD) may be used. For example, after creating vias in a polymer layer, a PVD process may be used to deposit a metal layer on the polymer layer to create an RDL layer. The inventors have found that care should be taken when correcting for warpage after a PVD process. The heating during the warpage correction process may lead to outgassing of the polymer layer under the metal layer (PVD process). The outgassing may cause bubbling beneath the surface of the metal layer which degrades the surface for fine pitch patterning. In some embodiments, warpage correction may be performed up to a PVD process, but not after the PVD process. In some embodiments, profiles may be created for various processes and/or various materials used in the process to control the warpage correction temperatures, ramping, and durations. The profiles allow for optimization of the wafer level packaging processes to increase fine pitch yields and produce repeatable results.

The inventors have discovered that the warpage correction process has other benefits that may be exploited even when warpage correction is not the main goal. In some embodiments, the warpage correction may be used even on low warpage substrates to make the wafer more pliable and relaxed.

Figure 2:
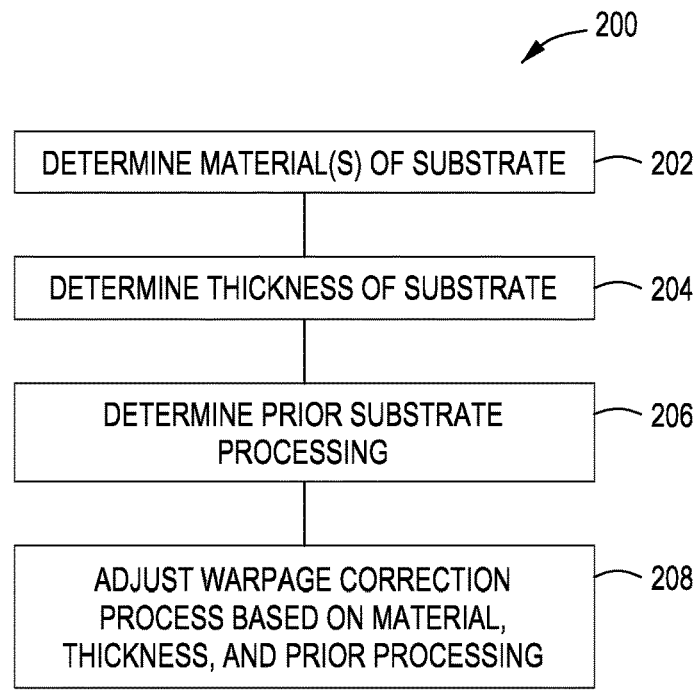
FIG. 2 is a method of adjusting warpage correction during a wafer level packaging process in accordance with some embodiments of the present principles.

FIG. 2 is a method 200 of adjusting warpage correction during a wafer level packaging process in accordance with some embodiments. In block 202, the material makeup of the substrate is determined or obtained from previous processing. In some embodiments, the glass transition temperatures for each type of material may be used to adjust the warpage correction parameters such as temperature, duration, and temperature ramping time. In block 204, the thickness of the substrate is determined or obtained from previous processing. In some embodiments, the thickness of each type of material may be used to adjust the warpage correction parameters such as temperature, duration, and temperature ramping time. In block 206, prior substrate processing is determined or known from current processing. In some embodiments, the prior substrate processing may be used to determine thermal budget allocations or in determining if lower warpage correction temperatures should be used (e.g., when a prior process includes a PVD process). In block 208, the warpage correction process is adjusted based on the material composition, thickness, and prior processing of the substrate.

Figure 3:
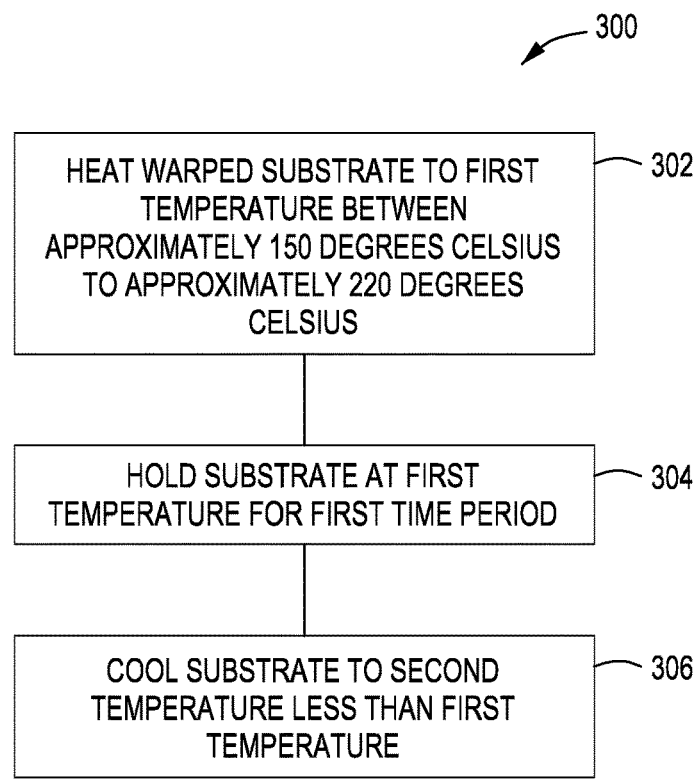
FIG. 3 is a method of performing warpage reduction in accordance with some embodiments of the present principles.

FIG. 3 is a method 300 of performing warpage reduction in accordance with some embodiments. In block 302, a substrate is heated to a first temperature between approximately 150 degrees Celsius to approximately 220 degrees Celsius. In some embodiments, the first temperature may be based on the glass transition temperature of a substrate material. The glass transition temperature is the temperature at which a polymer turns from a glassy material to a rubbery material. The glass transition temperature of a material may be above approximately 160 degrees Celsius to approximately 170 degrees Celsius. For each substrate material, the glass transition temperature will vary. In some embodiments, the substrate is heated close to the glass transition temperature of the material or slightly above. In some embodiments, the glass transition temperature is based on the material used as the substrate and the material used in a process. The first temperature value is adjusted accordingly. In some embodiments, a first temperature ramp may be linear and a ramping time to obtain the first temperature may vary based upon materials and material parameters (e.g., thickness, etc.) being heated. In block 304, the substrate is held at the first temperature for a first time period. The duration of the first temperature may be adjusted based on the type of material or substrate and other physical parameters such as a thickness of the wafer. In block 306, the substrate is cooled to a second temperature that is less than the first temperature. The second temperature may be based on the type of material or substrate and other physical parameters such as a thickness of the wafer. In some embodiments, a second temperature ramp may be linear and a ramping time to obtain the second temperature may vary based upon materials and material parameters (e.g., thickness, etc.) being heated. In some embodiments, the substrate may be cooled by a plurality of heat transfer channels in a substrate support to remove substrate warpage (see FIG. 4 below).

In some embodiments, the first temperature of the warpage correction may be lower than a glass transition temperature to reduce potential outgassing of the polymer layer after a PVD process. In some embodiments, the first temperature of a first warpage correction process may be higher than first temperatures of subsequent warpage correction processes. In some embodiments, the first temperature of a warpage correction process may be based on at least one first temperature of a prior first temperature of a warpage correction process. In some embodiments, parameters of the first temperature ramp, the first temperature, parameters of the second temperature ramp, and/or the second temperature may be adjusted based on the occurrence of a prior PVD process to reduce outgassing of underlying polymer material. The inventors have found that a carefully controlled temperature transition at or near the glass transition temperatures may reduce or eliminate outgassing of the underlying polymer layers while providing sufficient warpage correction, increasing yields after PVD processes.

Figure 4:
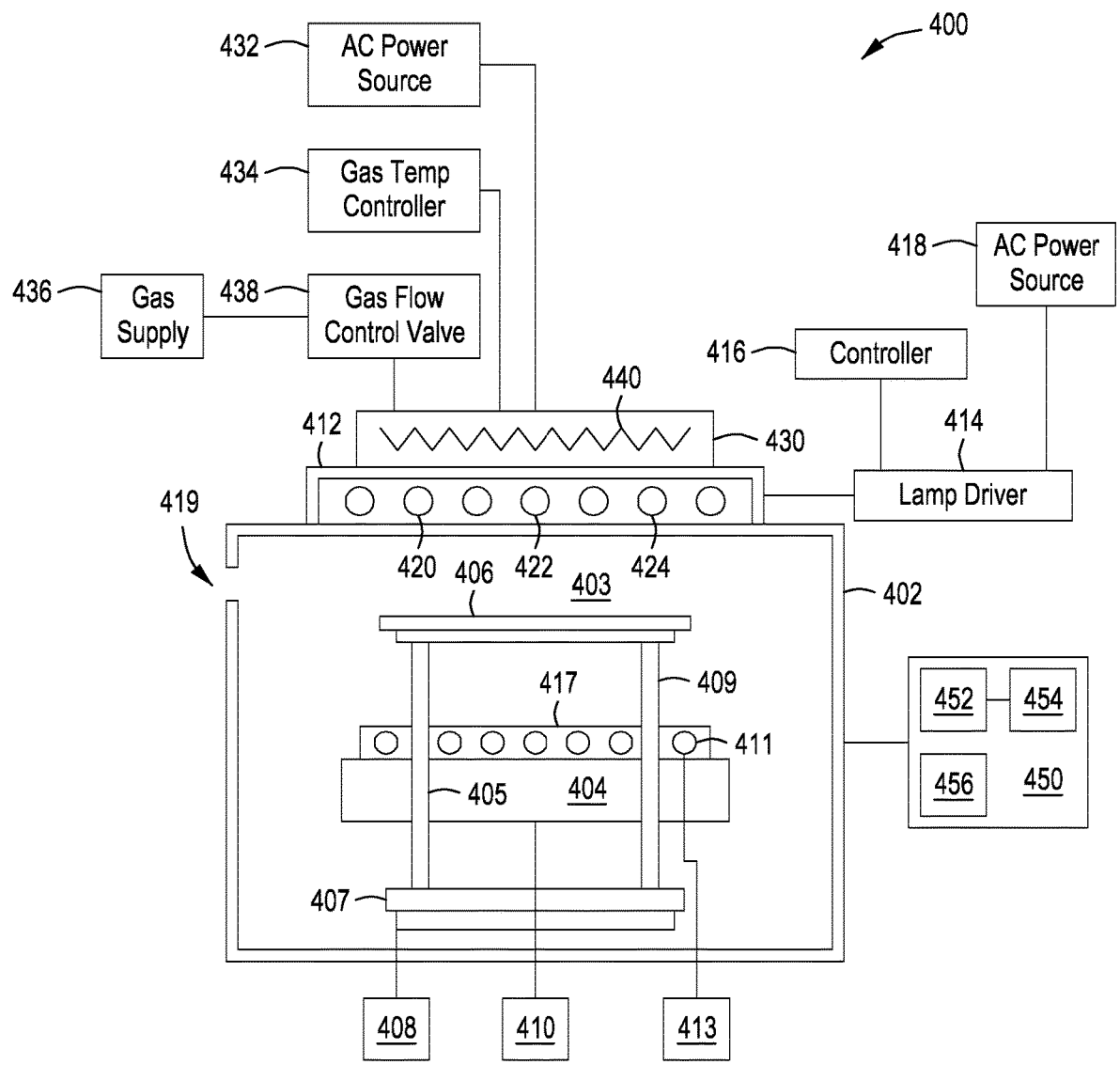
FIG. 4 is a cross-sectional view of a substrate processing system for controlling substrate warpage in accordance with some embodiments of the present principles.

FIG. 4 depicts a cross-sectional view of a substrate processing system 400 suitable for performing the methods of the present principles in accordance with some embodiments. As depicted in FIG. 4, the substrate processing system 400 comprises a chamber 402 enclosing a processing volume 403, a support 404 for supporting a substrate 406, a lift pin assembly 407, a vacuum source 410, a heat transfer supply 413, a radiative heat source (lamp array 412), lamp driver 414, controller 416, and a lamp driver AC power source 418. A gas delivery system 430 for the chamber 402 may also be used in conjunction with or in place of the lamp array 412. The gas delivery system 430 may include a heating element 440, a heating element AC power source 432, a gas temperature controller 434, and a gas flow control valve 438 for regulating a gas supply 436. One or more temperature sensors and associated hardware (not shown) may be provided and coupled to the controller for controlling the temperature within the processing volume 403. The substrate 406 is, for example, a semiconductor wafer. The substrate 406 may comprise an epoxy coating disposed thereon.

The lift pin assembly 407 includes a plurality of lift pins 409 that extend through a corresponding plurality of lift pin channels 405 formed in the support 404. The lift pin assembly 407 may be raised and lowered by a driving mechanism 408 (such as a motor or actuator) to raise and lower the substrate 406 onto or off of a support surface 417 of the support 404. The chamber 402 may further include an opening 419 through which a robotic arm (not shown) extends to insert/remove the substrate 406 onto/from the plurality of lift pins 409. The lift pin assembly 407 is moveable between a first position, in which the substrate is proximate the lamp array 412, and a second position, in which the substrate 406 rests on the support surface 417. In some embodiments, the substrate 406 is heated to first predetermined temperature in the first position and cooled to second predetermined temperature in the second position.

In some embodiments, the support 404 is a vacuum chuck to which the vacuum source 410 is coupled to chuck the substrate 406 onto the support surface 417. In some embodiments, the support 404 may alternatively be an electrostatic chuck. The support 404 includes a plurality of heat transfer channels 411 fluidly coupled to a heat transfer supply 413. In some embodiments, for example, the heat transfer supply 413 may provide a coolant to the heat transfer channels 411 to cool the substrate 406 placed atop the support surface 417 of the support 404.

The lamp driver AC power source 418 delivers AC power to the lamp driver 414, the operation of which is controlled by the controller 416. The lamp driver 414 distributes power to the lamp array 412. In turn, the lamp array 412 produces heat to thermally treat the substrate 406 within the chamber 402. In some embodiments, the lamp array 412 comprises one or more lamps, each may be individually controlled by the controller 416 through the lamp driver 414. As illustrated in FIG. 4, three lamps (420, 422, 424) are shown, although a lesser number or a greater number of lamps may be used. Each lamp 420, 422, 424 may be individually controlled by the controller 416 to provide heat to corresponding heating zones. Because the lamps may be individually controlled, the temperature in the heating zones may also be controlled.

In some embodiments, the gas delivery system 430 may provide an inert gas such as, but not limited to, nitrogen or argon and the like from the gas supply 436 to reduce oxidizing of the substrate 406, especially for metal wafers when heat is applied. The gas flow control valve 438 regulates the amount of gas supplied by the gas supply 436 to the processing volume 403. In some embodiments, the gas delivery system 430 may also include the heating element 440 to heat the gas as the gas enters the processing volume 403. The temperature of the heating element 440 is controlled by the gas temperature controller 434. Power for the heating element 440 is provided by the heating element AC power source 432. The gas provided by the gas delivery system 430 increases temperature uniformity of the substrate 406 during warpage correction processes.

Embodiments in accordance with the present principles may be implemented in hardware, firmware, software, or any combination thereof. Embodiments may also be implemented as instructions stored using one or more computer readable media, which may be read and executed by one or more processors. A computer readable medium may include any mechanism for storing or transmitting information in a form readable by a machine (e.g., a computing platform or a "virtual machine" running on one or more computing platforms). For example, a computer readable medium may include any suitable form of volatile or non-volatile memory. In some embodiments, the computer readable media may include a non-transitory computer readable medium.

The chamber 402 may also include a system controller 450. The system controller 450 includes a programmable central processing unit (CPU) 452 that is operable with a memory 454 and a mass storage device, an input control unit, and a display unit (not shown), such as power supplies, clocks, cache, input/output (I/O) circuits, and the liner, coupled to the various components of the processing system to facilitate control of the substrate processing. To facilitate control of the chamber 402 described above, the CPU 452 may be one of any form of general purpose computer processor that can be used in an industrial setting, such as a programmable logic controller (PLC), for controlling various chambers and sub-processors. The memory 454 is coupled to the CPU 452 and the memory 454 is non-transitory and may be one or more of random access memory (RAM), read only memory (ROM), floppy disk drive, hard disk, or any other form of digital storage, local or remote. Support circuits 456 are coupled to the CPU 452 for supporting the processor. Applications or programs for charged species generation, heating, and other processes are generally stored in the memory 454, typically as software routine. The software routine may also be stored and/or executed by a second CPU (not shown) that is remotely located from the chamber 402 being controlled by the CPU 452.

The memory 454 is in the form of computer-readable storage media that contains instructions, when executed by the CPU 452, to facilitate the operation of the chamber 402. The instructions in the memory 454 are in the form of a program product such as a program that implements the method of the present disclosure. The program code may conform to any one of a number of different programming languages. In one example, the disclosure may be implemented as a program product stored on a computer-readable storage media for use with a computer system. The program(s) of the program product define functions of the aspects (including the methods described herein). Illustrative computer-readable storage media include, but are not limited to: non-writable storage media (e.g., read-only memory devices within a computer such as CD-ROM disks readable by a CD-ROM drive, flash memory, ROM chips, or any type of solid-state non-volatile semiconductor memory) on which information is permanently stored; and writable storage media (e.g., floppy disks within a diskette drive or hard-disk drive or any type of solid-state random access semiconductor memory) on which alterable information is stored. Such computer-readable storage media, when carrying computer-readable instructions that direct the functions of the methods described herein, are aspects of the present principles.

While the foregoing is directed to embodiments of the present principles, other and further embodiments of the principles may be devised without departing from the basic scope thereof.

The invention claimed is:

1. A method of fine pitch patterning on a substrate in a wafer level packaging process, comprising:
performing a first warpage correction process on the substrate by ramping to and holding the substrate at a first temperature for a first duration and ramping to and holding a second temperature for a second duration, wherein the first temperature is greater than the second temperature;
forming vias in a polymer layer on the substrate;
curing the polymer layer;
performing a second warpage correction process on the substrate by ramping to and holding the substrate at a third temperature for a third duration and ramping to and holding the substrate at a fourth temperature for a fourth duration, wherein the third temperature is greater than the fourth temperature; and
forming a redistribution layer on the substrate with a fine pitch patterning having a line/space of 10/10 µm or less.

2. The method of claim 1, wherein the fine pitch patterning has a line/space of 5/5 µm or less.

3. The method of claim 1, wherein the fine pitch patterning has a line/space of 2/2 µm or less.

4. The method of claim 1, wherein the substrate has a warpage of 500 µm or less after the second warpage correction process.

5. The method of claim 4, wherein the substrate has a warpage of 400 µm or less after the second warpage correction process.

6. The method of claim 1, wherein the first temperature of the first warpage correction process is greater than the third temperature of the second warpage correction process.

7. The method of claim 1, wherein the first temperature of the first warpage correction process is approximately equal to the third temperature of the second warpage correction process.

8. The method of claim 1, wherein the first temperature is adjusted prior to performing additional warpage correction processes to increase warpage correction performance.

9. The method of claim 1, wherein the first temperature is approximately a glass transition temperature of the polymer layer on the substrate.

10. The method of claim 1, wherein the first temperature, the second temperature, the third temperature, or the fourth temperature is obtained by ramping linearly.

11. The method of claim 1, wherein the first temperature is lower than a glass transition temperature of the polymer layer when a plasma vapor deposition (PVD) process has been performed prior to the first warpage correction process.

12. The method of claim 1, wherein the substrate is a reconstituted wafer composed of multiple dies.

13. The method of claim 1, further comprising:
   performing a chemical mechanical polishing (CMP) process to enhance the fine pitch patterning.

14. A non-transitory, computer readable medium having instructions stored thereon that, when executed, cause a method of fine pitch patterning on a substrate in a wafer level packaging process to be performed, the method comprising:

performing a first warpage correction process on the substrate by ramping to and holding the substrate at a first temperature for a first duration and ramping to and holding a second temperature for a second duration, wherein the first temperature is greater than the second temperature;

forming vias in a polymer layer on the substrate;

curing the polymer layer;

performing a second warpage correction process on the substrate by ramping to and holding the substrate at a third temperature for a third duration and ramping to and holding the substrate at a fourth temperature for a fourth duration, wherein the third temperature is greater than the fourth temperature; and forming a redistribution layer on the substrate with a fine pitch patterning having a line/space of 10/10 µm or less.

15. The non-transitory, computer readable medium of claim 14, wherein the first temperature of the first warpage correction process is greater than the third temperature of the second warpage correction process, wherein the substrate has a warpage of 400 µm or less after the second warpage correction process, and wherein the fine pitch patterning has a line/space is 2/2 µm or less.

* * * * *